United States Patent
Lee et al.

(10) Patent No.: US 6,570,388 B2
(45) Date of Patent: May 27, 2003

(54) TRANSMISSION LINE PULSE METHOD FOR MEASURING ELECTROSTATIC DISCHARGE VOLTAGES

(75) Inventors: Ming-Tsan Lee, Tainan (TW); Chuan-Hsi Liu, Taipei (TW)

(73) Assignee: United Microeletronics Corp. (TW)

( * ) Notice: Subject to any disclaimer, the term of this patent is extended or adjusted under 35 U.S.C. 154(b) by 76 days.

(21) Appl. No.: 09/828,377

(22) Filed: Apr. 6, 2001

(65) Prior Publication Data

US 2002/0171431 A1 Nov. 21, 2002

(51) Int. Cl.$^7$ ................................................ G01R 29/12
(52) U.S. Cl. ....................... 324/457; 324/678; 324/765
(58) Field of Search ............................... 257/355, 358; 324/457, 637, 678, 765

(56) References Cited

U.S. PATENT DOCUMENTS

| | | | | |
|---|---|---|---|---|
| 5,804,977 A | * | 9/1998 | Consiglio | 324/678 |
| 6,147,538 A | * | 11/2000 | Andresen et al. | 327/309 |
| 6,429,674 B1 | * | 8/2002 | Barth et al. | 324/763 |

* cited by examiner

*Primary Examiner*—Christine Oda
*Assistant Examiner*—Walter Benson

(57) ABSTRACT

The present invention relates to a method which introduce a parasitic series resistance for solving electrostatic discharge voltages by using transmission line pulse method and least square error solution method. In present invention, we introduce a parasitic series resistance, Rs, into the equation which presents the correlation between the transmission line pulse method and human body model. The equation is then rewritten as electrostatic discharge voltage=electrostatic discharge current×(the human body equivalent resistance+the parasitic series resistance)

We can obtain the optimal parasitic series resistance and electrostatic discharge voltage by using the least square error solution method. By making a comparison between the electrostatic discharge voltage obtained from transmission line pulse method and that obtained from human body model test method, we can find that the correlation of the transmission line pulse method and human body model in this invention is better than that in conventional method.

1 Claim, 5 Drawing Sheets

| | $V_{HBM}$ | TLPG 1500 * $I_{t2}$ | \|$V_{HBM}$ − 1500 * $I_{t2}$\|/$V_{HBM}$ |
|---|---|---|---|
| W/L = 100/0.5 μm | 1750 V | 1439 V | 17.77% |
| W/L = 300/0.5 μm | 5413 V | 4958 V | 8.41% |
| W/L = 400/0.5 μm | 7325 V | 6449 V | 11.96% |

FIG. 5

| | $V_{HBM}$ | TLPG (1500 + 183.6) * $I_{t2}$ | \|$V_{HBM}$ − (1500 + 183.6) * $I_{t2}$\|/$V_{HBM}$ | TLPG (1500 + 194) * $I_{t2}$ | \|$V_{HBM}$ − (1500 + 194) * $I_{t2}$\|/$V_{HBM}$ |
|---|---|---|---|---|---|
| W/L = 100/0.5 μm | 1750 V | 1599 V | 8.6% | 1609 V | 8.0% |
| W/L = 300/0.5 μm | 5413 V | 5563 V | 2.76% | 5599 V | 3.4% |
| W/L = 400/0.5 μm | 7325 V | 7306 V | 0.3% | 7354 V | 0.4% |

FIG. 6

TRANSMISSION LINE PULSE METHOD FOR MEASURING ELECTROSTATIC DISCHARGE VOLTAGES

BACKGROUND OF THE INVENTION

1. Field of the Invention

The present invention generally relates to a method for measuring electrostatic discharge voltages by using transmission line pulse method, and in particular to a method which introduces a parasitic series resistance for solving electrostatic discharge voltages by using transmission line pulse method and least square error solution method.

2. Description of the Prior Art

In integrated circuit manufacturing and handling environments, there are three principal sources of electrostatic charging and discharging. The first and most common source to date of electrostatic discharge (ESD) is that due to human handling. The second source of ESD is that which takes place in automated test and handling systems. The equipment can accumulate static charge due to improper grounding, which is then transmitted through the IC when it is picked up for placement in the test socket or carrier. The third possibility is that the IC itself is charged during transport or because of contact with a highly charged surface or material. The IC remains charged until it comes into contact with a grounded surface such as a large metal plate or a test socket. It is then discharged through its pins and the large currents in the internal interconnect can result in high voltages inside the device. These voltages can cause damage to the very thin dielectrics and insulators present in the IC.

The three ESD mechanisms are known as (1) human body model (HBM), (2) machine model (MM), and (3) charged device model (CDM).

Failure modes for the HBM and the MM test methods are typically found in the diffusion regions of the protection circuits. However, CDM failures are usually gate oxide damage either at the pad, or in some cases internally in the circuit. The most common location for gate oxide damage is in the pMOS transistor of the input buffer. The HBM test method is the most popular standard method, and an equivalent ESD circuit for modeling HBM is shown in FIG. 1, and the discharge waveform of HBM is then shown in FIG. 2.

The high current, short duration pulse can be easily reproduced using a charged transmission line. The advantage of the transmission line pulse (TLP) tester is that a constant current pulse is generated which enables the behavior of the protection structure under current conditions to be studied. The double exponential and oscillating pulses of standard ESD testers make it difficult to determine how the protection structure operates. Hence, the TLP tester has become popular with many ESD protection circuit designers and researchers into protection circuit operation and physics.

The TLP tester configuration has the advantage that it is easily designed to avoid sensitivity to internal parasitic elements. Hence, we obtain reproducible testing which can be correlated to HBM or MM type discharges.

The relationship between TLP method and HBM can be described as the following equation:

$$V_{ESD\text{-}HBM} = I_{t2} \times R_{HBM} \quad \text{Eq.(1)}$$

wherein the $V_{ESD\text{-}HBM}$ is the electrostatic discharge voltage measured by the human body method, $I_{t2}$ is the second breakdown trigger current, and the $R_{HBM}$ is the resistance of a resistor used in HBM. $R_{HBM}$ is set equal to 1500 ohm in the TLP method. After measuring the second breakdown trigger current by TLP method, we will be able to calculate an equivalent electrostatic discharge voltage which is assumed to be equal to that measured by HBM.

In the Eq. 1, the $R_{HBM}$ is just a human body equivalent resistance, and the resistance of devices and leads is neglected. However, we found that the resistance of devices and leads is significant; thus we introduce the parasitic series resistance, Rs, to modify the Eq. 1.

SUMMARY OF THE INVENTION

It is an object of the invention to introduce a parasitic series resistance to modify the relationship between the transmission line pulse method and human body model.

It is another object of the invention to solve the parasitic series resistance and electrostatic discharge voltages.

According to the foregoing objects, the present invention introduces a parasitic series resistance into the Eq. 1, and then the equation become electrostatic discharge voltage=electrostatic discharge current×(the human body equivalent resistance+parasitic series resistance)

In present invention, electrostatic discharge voltages and parasitic series resistances can be obtained by using the least square error solution method.

Firstly, the second breakdown trigger current $I_{t2}$ was measured by transmission line pulse method, and the electrostatic discharge voltage $V_{ESD\text{-}HBM}$ was measured by human body model test method. Then, the sum of square $S=\Sigma[\text{the electrostatic discharge voltage measured by human body model test method } V_{ESD\text{-}HBM} - \text{the second breakdown trigger current measured by transmission line pulse method } I_{t2} \times (\text{the human body equivalent resistance } R_{HBM} + \text{parasitic series resistance Rs})]^2$ In order to get a optimal value of Rs, the sum of square is minimized. Then we can apply the value of parasitic serial resistance into Eq.2 to calculate the human body equivalent electrostatic discharge voltage of TLP method ($V_{ESD\text{-}TLP}$).

Compare the human body equivalent electrostatic discharge voltage obtained from the TLP method with the electrostatic discharge voltage measured by HBM test method, we can find that the equation provided in this invention is better than that provided in prior art.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 5 show a Comparison between the electrostatic discharge voltages obtained by conventional HBM and that obtained by TLP methods according to Eq. (1).

FIG. 6 shows a Comparison between the electrostatic discharge voltages obtained by conventional HBM and that obtained by TLP methods according to Eq. (2).

DESCRIPTION OF THE PREFERRED EMBODIMENT

In the prior art, the relationship between TLP method and HBM is according to Eq. 1, and the second breakdown trigger current can be obtained by TLP method. Then, the current is multiplied by the human body equivalent resistance ($R_{HBM}$) to get the human body equivalent electrostatic discharge voltage ($V_{ESD-TLP}$) The result is shown in the FIG. 5. The $R_{HBM}$ used in HBM is a constant which is set equal to 1500 ohm. The FIG. 5 also shows the electrostatic discharge voltage ($V_{ESD-HBM}$) obtained by HBM test method and the relative difference expressed in percentage between the $V_{ESD-TLP}$ and $V_{ESD-HBM}$.

As shown in FIG. 5, we can find that the relative differences expressed in percentage between $V_{ESD-TLP}$ and $V_{ESD-HBM}$ are averagely greater than 10%. Therefore, we think that the Eq. 1 can not describe the relationship between the TLP method and HBM. In addition, we note that the $R_{HBM}$ in Eq. 1 is only a resistance of a resistor use in HBM, and the resistance of devices and lines are not considered. So we introduce a parasitic series resistance to modify the Eq.1. Thus, the Eq.1 can be rewritten to Eq.2 as following $$V_{ESD-HBM} = I_{t2} \times (R_{HBM} + R_S) \qquad \text{Eq. 2}$$

The $V_{t2}$ and Rs in Eq.2 are two independent variables, and they can not be solved directly and exactly. But we can use the least square error solution method to find the optimal values. The first step of the least square error solution method used to solve the Rs is to measure the $V_{ESD-HBM}$ by HBM test method and the $I_{t2}$ by TLP method. Then the sum of square, S, is expressed as the Eq.3. When the sum of square is minimized, the Rs can be expressed as Eq.4. Thus, after getting the $V_{ESD-HBM}$ and $I_{t2}$, we can calculate the Rs according to the Eq.4, and then calculate the the human body equivalent electrostatic discharge voltage ($V_{ESD-TLP}$) derived form the TLP method according to Eq.2.

$$S = \sum_{i=1}^{m} \delta_i^2 = \sum_{i=1}^{m} [V_{ESD-HBM_i} - V_{ESD-TLP_i}]^2 = \sum_{i=1}^{m} [V_{ESD-HBM_i} - (R_{HBM} + R_S) \times I_{t2_i}]^2 \qquad \text{Eq. 3}$$

$$R_S = \frac{\sum_{i=1}^{m} [V_{ESD-HBM_i} - R_{HBM} \times I_{t2_i}] \times I_{t2_i}}{\sum_{i=1}^{m} (I_{t2_i})^2} \qquad \text{Eq. 4}$$

Figure 1:
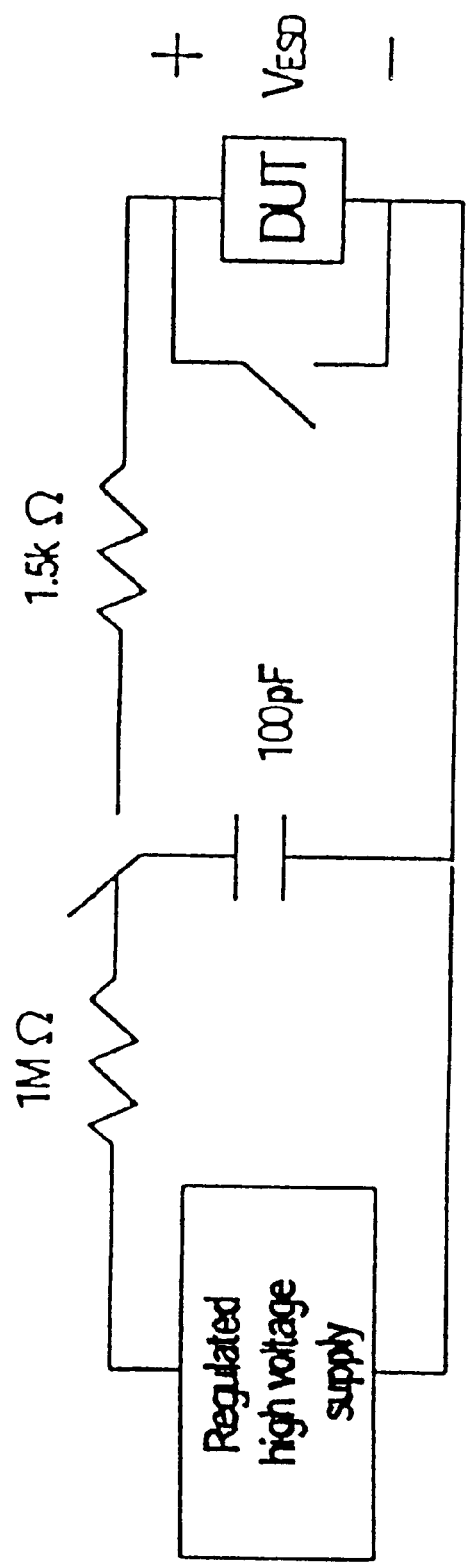
FIG. 1 shows an equivalent ESD circuit for modeling HBM discharge waveforms.
Figure 2:
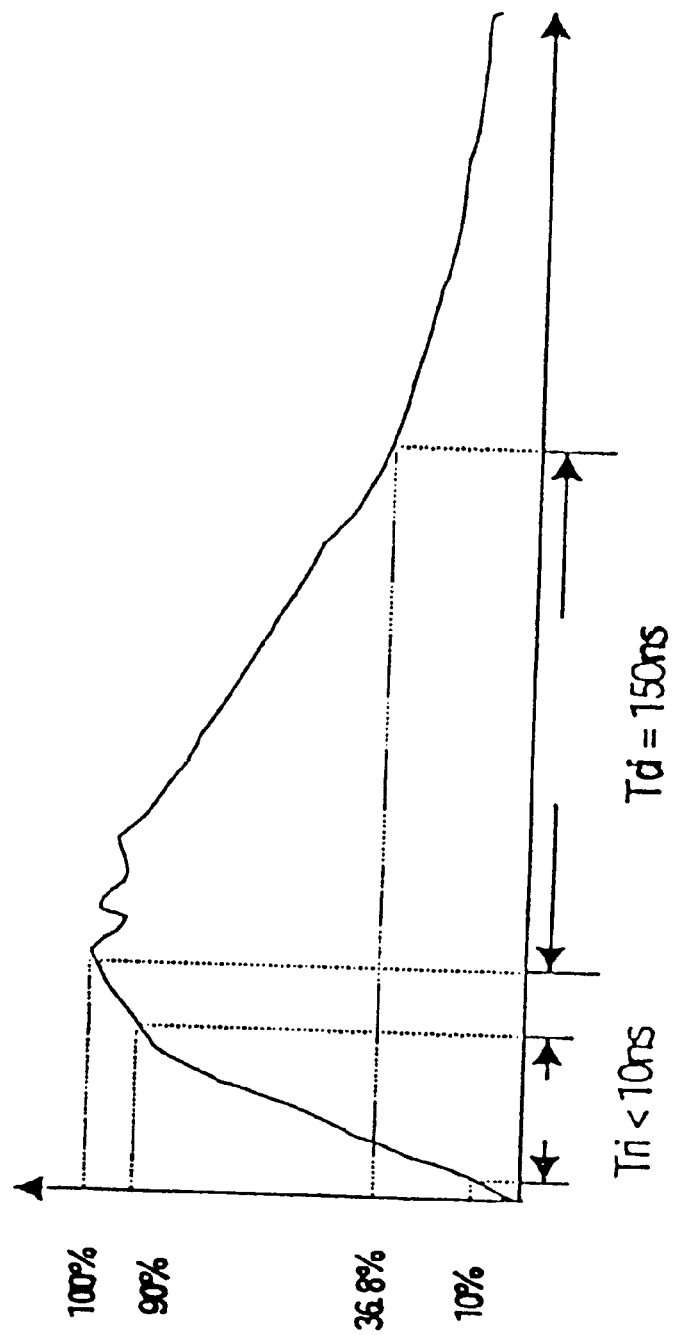
FIG. 2 shows the discharge waveform of HBM.
Figure 3:
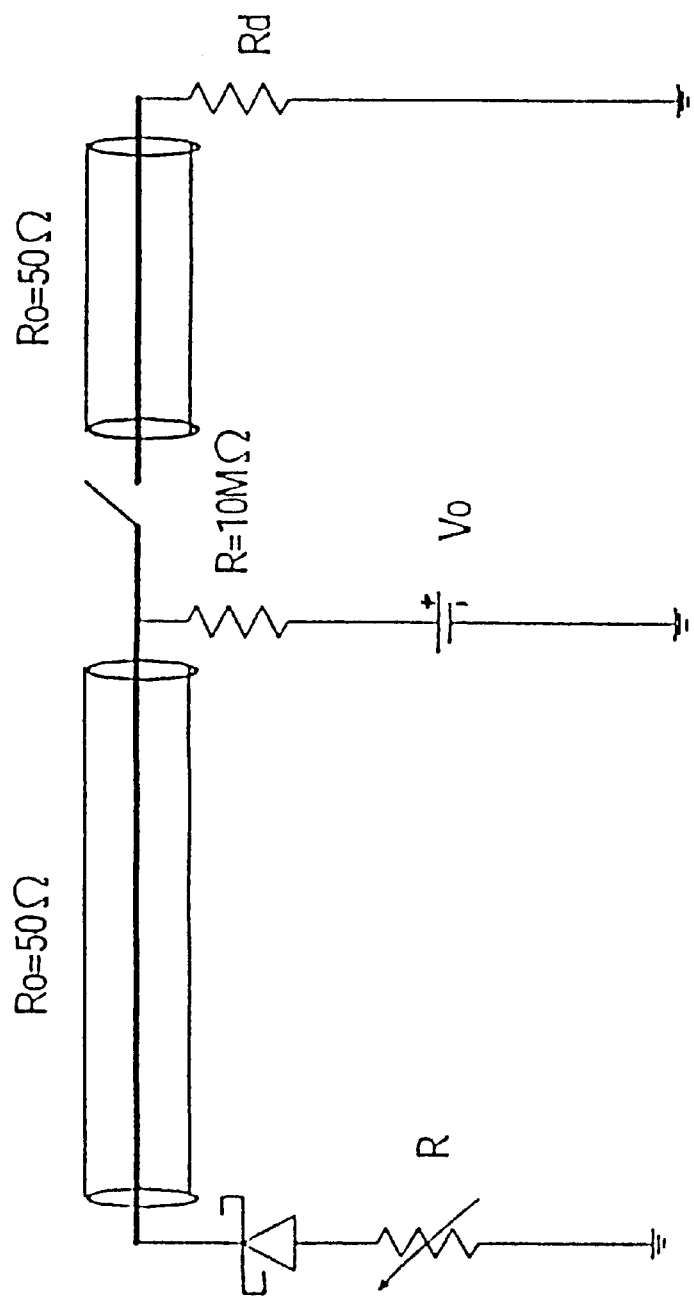
FIG. 3 shows an equivalent ESD circuit of TLP system.
Figure 4:
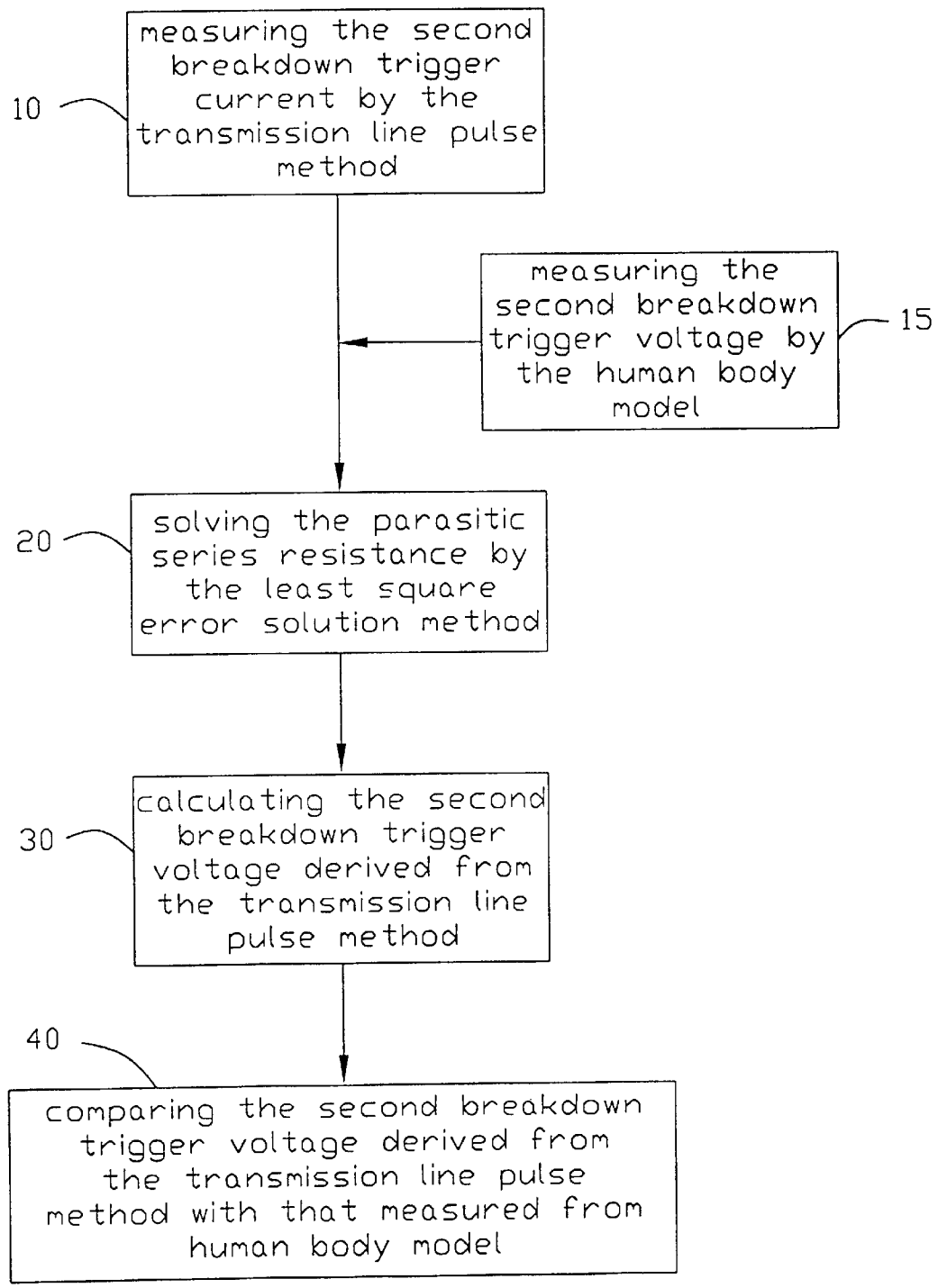
FIG. 4 is a flowchart for explaining the method provided in this invention.

In accordance with the above method, we use gate-grounded NMOS transistor to be the protecting structure for ESD in this embodiment. The flowchart of this embodiment is shown as FIG. 4. Firstly, the second breakdown trigger currents, $I_{t2}$, of samples to the number of m are measured by TLP method 10. And the electrostatic discharge voltage, $V_{ESD-HBM}$, is measured by HBM test method 15. Each measured current or voltage, as shown in FIG. 6, is an average of eight measurements. Secondly, the Rs can be calculated according to Eq.4 derived from the least square error solution method 20, and the value of Rs is 182 ohm. Then, we can calculated the human body equivalent electrostatic discharge voltage derived form TLP method $V_{ESD-TLP}$ 30 by applying the value of Rs into the Eq.2. Finally, we calculate the relative difference of the electrostatic discharge voltages measured from HBM test method $V_{ESD-HBM}$ and that derived from TLP method $V_{ESD-TLP}$. All results are shown in FIG. 6, and we can find that the correlation of $V_{ESD-TLP}$ and $V_{ESD-HBM}$ in this invention is better than that in prior art.

In addition, the parasitic series resistance can also be obtained by the simplified 4th order lumped element model. This model is described as the Eq.5 and Eq.6, wherein the Ls is the parasitic series inductance and is set equal to 7.5 uH; the $C_{HBM}$ is the capacitance of this model and is set equal to 100 pF. In theory, when the I(t) in the Eq.5 equals to $I_{t2}$, it will be the maximum as well as the f(t). We can obtain the parasitic series resistance from the Eq.4 and Eq.5, and it is 194 ohm in this embodiment. Then we can calculate the human body equivalent electrostatic discharge voltages derived from TLP method by Eq.2, and the relative differences expressed in percentage between the electrostatic discharge voltages measured from HBM test method and that obtained from the simplified 4th order lumped element model. All the results are also shown in FIG. 6. We can find that the results obtained by least square error solution method are in accordance with that obtained by the simplified 4th order lumped element model.

$$I(t) = V_{HBM} \times f(t) / (R_{HBM} + R_S) \qquad \text{Eq. 5}$$

$$f(t) = \left(1 - e^{\frac{-(R_{HBM}+R_S) \times t}{L_S}}\right) \times \left(e^{\frac{-t}{(R_{HBM}+R_S) \times C_{HBM}}}\right) \qquad \text{Eq. 6}$$

Thus, we think that the TLP method is well correlated to HBM by introducing a parasitic series resistance.

Although specific embodiments have been illustrated and described, it will be obvious to those skilled in the art that various modifications may be made without departing from what is intended to be limited solely by the appended claims.

What is claimed is:

1. A method for determining a electrostatic discharge voltage derived from the transmission line pulse method, comprising the steps of:

determining a resistance of an intrinsic resistor which is used in human body model, wherein said resistance of the intrinsic resistor is usually set equal to a constant;

measuring a first electrostatic discharge voltage by the human body model test method;

measuring a second breakdown trigger current by the transmission line pulse method;

determining a parasitic series resistance by using a least square error solution method, wherein said parasitic series resistance is introduced to modify the relationship between the transmission line pulse method and the human body model test method; and determining a second electrostatic discharge voltage derived from the transmission line pulse method by multiplying said second breakdown trigger current by a sum of said resistance of the intrinsic resistor and said parasitic series resistance.

* * * * *